(12) United States Patent
Kwon et al.

(10) Patent No.: US 7,812,442 B2
(45) Date of Patent: Oct. 12, 2010

(54) HIGH-POWER BALL GRID ARRAY PACKAGE, HEAT SPREADER USED IN THE BGA PACKAGE AND METHOD FOR MANUFACTURING THE SAME

(75) Inventors: Heung-Kyu Kwon, Kyungki-Do (KR); Tae-Je Cho, Kyungki-Do (KR); Min-Ha Kim, Choongcheongnam-Do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 283 days.

(21) Appl. No.: 11/778,536

(22) Filed: Jul. 16, 2007

(65) Prior Publication Data

US 2007/0258215 A1    Nov. 8, 2007

Related U.S. Application Data

(62) Division of application No. 10/459,400, filed on Jun. 10, 2003, now Pat. No. 7,258,808.

(30) Foreign Application Priority Data

Jun. 12, 2002    (KR) ............................ 2002-0032972

(51) Int. Cl.
*H05K 7/20*    (2006.01)
*H01L 23/10*    (2006.01)

(52) U.S. Cl. ...................................... 257/706; 361/704

(58) Field of Classification Search ................. 257/706
See application file for complete search history.

(56) References Cited

U.S. PATENT DOCUMENTS 4,485,291 A    11/1984    Nomura et al.

(Continued)

FOREIGN PATENT DOCUMENTS

JP    06-021610    1/1994

(Continued)

OTHER PUBLICATIONS

English language abstract of Korean Publication No. 2001-0008549.

(Continued)

*Primary Examiner*—Jarrett J Stark
*Assistant Examiner*—Lawrence Tynes, Jr.
(74) *Attorney, Agent, or Firm*—Volentine & Whitt, PLLC

(57) ABSTRACT

Provided are a high-power ball grid array (BGA) and a method for manufacturing the high-power BGA. The high-power BGA includes a printed circuit board which has a through hole at its center, connection pads which are formed on the bottom of the printed circuit board, matrix solder balls which surround the through hole and are adjacent to the connection pads on the bottom of the printed circuit board, a heat spreader which is formed on the top surface of the printed circuit board and includes an insulating layer of a high thermal conductivity, a semiconductor chip which is mounted downwardly on the bottom surface of the heat spreader, within the through hole, and includes a plurality of pads for bonding via gold wires with the connection pad, and a passive film which fills the through hole and is formed at the bottom of the semiconductor chip. By interposing a ceramic between the semiconductor chip and the heat spreader, for insulating, the generation of charges between the semiconductor chip and the heat spreader can be sharply reduced, and defects such as ESD (electrostatic discharge) can be reduced when testing for the ESD and mounting the package.

10 Claims, 4 Drawing Sheets

U.S. PATENT DOCUMENTS

| | | | |
|---|---|---|---|
| 5,055,967 A * | 10/1991 | Sukonnik et al. | 361/706 |
| 5,583,378 A * | 12/1996 | Marrs et al. | 257/710 |
| 5,689,091 A * | 11/1997 | Hamzehdoost et al. | 174/255 |
| 5,909,058 A | 6/1999 | Yano et al. | |
| 6,020,637 A * | 2/2000 | Karnezos | 257/738 |
| 6,028,489 A | 2/2000 | Juang et al. | |
| 6,060,778 A * | 5/2000 | Jeong et al. | 257/710 |
| 6,184,465 B1 | 2/2001 | Corisis | |
| 6,197,435 B1 | 3/2001 | Tsujimura et al. | |
| 6,292,369 B1 * | 9/2001 | Daves et al. | 361/719 |
| 6,377,461 B1 | 4/2002 | Ozmat et al. | |
| 6,442,043 B1 | 8/2002 | Seki et al. | |
| 6,562,655 B1 | 5/2003 | Glenn et al. | |
| 7,258,808 B2 * | 8/2007 | Kwon et al. | 216/13 |
| 2002/0180064 A1 * | 12/2002 | Hwan et al. | 257/780 |

FOREIGN PATENT DOCUMENTS

| | | |
|---|---|---|
| JP | 08-222670 | 8/1996 |
| JP | 9-199629 | 7/1997 |
| JP | 11-135689 | 5/1999 |
| JP | 2000-183236 | 6/2000 |
| JP | 2001-144230 | 5/2001 |
| KR | 2001-0008549 | 2/2001 |

OTHER PUBLICATIONS

English language abstract of Japanese Publication No. 06-021610.
English language abstract of Japanese Publication No. 9-199629.

* cited by examiner

HIGH-POWER BALL GRID ARRAY PACKAGE, HEAT SPREADER USED IN THE BGA PACKAGE AND METHOD FOR MANUFACTURING THE SAME

CROSS REFERENCE TO RELATED APPLICATIONS

This application is a divisional of U.S. patent application Ser. No. 10/459,400, filed Jun. 10, 2003, now issued as U.S. Pat. No. 7,258,808, which is claims priority from Korean Patent Application No. 2002-32972, filed on Jun. 12, 2002, the disclosure of which are incorporated herein in its entirety by reference.

BACKGROUND OF THE INVENTION

1. Field of the Invention

The present invention relates to semiconductor packages and, more particularly, to a high-power ball grid array (BGA) package having a heat spreader, a method for manufacturing the heat spreader, a BGA printed circuit board (PCB) to which the method is applied, and a method for manufacturing the BGA PCB.

2. Description of the Related Art

As devices become highly integrated, the number of connection pads in a semiconductor device such as a semiconductor memory device increases. Thus, the number of lead lines in a package included in a PCB also increases. As the number of lead lines increases, a lead frame of the conventional package technology cannot be applied to a highly-integrated semiconductor chip having over 400 lead lines. Accordingly, a BGA package has been introduced in which package output terminals are arranged on a large bottom board of the package.

The BGA package includes a square-shaped main body, a semiconductor chip which is mounted on the top surface of the main body, and matrix solder balls at the bottom surface of the main body which contact the printed circuit board and thus can be arranged and mounted on pads of the printed circuit board by using a reflow process.

Such BGA package requires a heat spreader on the surface of the semiconductor chip so as to emit heat to the outside the package when a considerable amount of heat is generated during the operation of the semiconductor chip. However, since a gold wire is formed upwardly to connect the semiconductor chip with the pad of the main body of the package, it is difficult to mount the heat spreader on the BGA package and so such BGA package is not appropriate for a high-power BGA package.

Referring to FIG. 12, there is provided a newly-introduced, high-power BGA package so as to overcome the heat emitting problem of the conventional BGA package. The newly-introduced, high-power BGA package includes a package printed circuit board 1120, a through portion 1200a at the center of the package circuit board 1120, pads for bonding (not shown) at the bottom surface of the printed circuit board 1120, a heat spreader 1110 which is connected to the top surface of the printed circuit board 1120, a supporting main body 1130 which is connected to the bottom surface of the heat spreader 1110, and a semiconductor chip 1101 which is mounted under the supporting main body 1130 within the through portion 1200a, includes a plurality of metal pads 1101a on its bottom surface, and is connected to pads for the bonding (not shown) and gold wires 1101b. Such high-power BGA package is capable of easily emitting heat away and cooling the semiconductor chip through the heat spreader 1110 that is stably mounted on the surface of the BGA package, even though the heat is generated in the semiconductor device.

The heat spreader 1110 of such high-power BGA package, however, is composed of conductive copper and surface-processed nickel, a fact which results in a constant voltage between the semiconductor chip 1101 and the heat spreader 1110 during the operation of the semiconductor chip 1101 and can cause damage to the semiconductor chip 1101 in many cases. The yield of BGA package of the semiconductor device decreases, and the reliability of the semiconductor device may not be ensured when mounting the semiconductor chip on the printed circuit board.

SUMMARY OF THE INVENTION

It is an object of the present invention to provide a high-power BGA package, a heat spreader used for the high-power BGA package, and a method for manufacturing the high-power BGA package and the heat spreader.

According to the object of the present invention, there is provided a high power ball grid array comprising a printed circuit board which has a through hole at its center, connection pads which are formed on the bottom of the printed circuit board, matrix solder balls which surround the through hole and are adjacent to the connection pads on the bottom of the printed circuit board, a heat spreader which is formed on the top surface of the printed circuit board and includes an insulating layer of a high thermal conductivity, a semiconductor chip which is mounted downwardly on the bottom surface of the heat spreader, within the through hole, and includes a plurality of pads for bonding via gold wires with the connection pad, and a passive film which fills the through hole and is formed at the bottom of the semiconductor chip.

Here, the printed circuit board is composed of at least one of a synthetic resin and a ceramic. The heat spreader comprises a chip supporting body to which the semiconductor chip can be adhered to, the ceramic film which is formed on the surface of the chip supporting body, a metal layer which is formed on the surface of the ceramic film, and a protection layer which is formed on the surface of the metal layer and protects the metal layer. Here, the ceramic is composed of at least one of AlN, BeO, and $Al_2O_3$.

The metal layer includes one of copper and a copper alloy. The protection layer is composed of nickel. The protection layer is formed by electroless plating.

In addition, in a region adjacent to the through hole, the printed circuit board further comprises a dam which surrounds the protection layer and protrudes from the printed circuit board.

A heat spreader for a high-power ball grid array, the heat spreader comprising a board for emitting heat which is formed by sequentially depositing a supporting main body having a board shape and made of a ceramic, a metal layer for emitting heat, and a protection layer on the surface of the supporting main body, a lower metal layer which is formed on the bottom surface of the supporting main body and has a region where the chip can be mounted, and a region which is formed at the center of the heat spreader and where the semiconductor chip can be adhered.

The supporting main body is composed of one of AlN, BeO, and $Al_2O_3$. The metal layer for emitting heat and the lower metal layer are composed of one of copper and a copper alloy. The protection layer is composed of one of nickel and a nickel alloy. The protection layer is formed by electroless plating.

A method for manufacturing a heat spreader for a high-power ball grid array, the method comprising (a) preparing an insulating board, (b) forming a metal layer on both surfaces of the insulating board formed of a ceramic, (c) patterning the metal layer on one surface of the insulating board formed of a ceramic, to form a region to which the semiconductor chip can be adhered, (d) cutting the metal layer on both surfaces of the insulating board formed of a ceramic to a predetermined size and recessing the surface of the insulating board of a ceramic to a predetermined depth, and (e) forming a protection layer on the surface of the metal layer on both surfaces of the insulating board formed of a ceramic.

Here, the insulating board is formed of a ceramic.

Step (b) further comprises preparing the metal layer having the same size as the insulating layer, and adhering the metal layer onto both surfaces of the insulating layer. The metal layer is composed of one of copper and a copper alloy. Adhering the metal layer to the insulating layer is performed via one of direct copper bonding and metal brazing.

Step (c) further comprises forming a photoresist on the metal layer on one surface of the insulating layer, forming a pattern of a chip receiving portion where the semiconductor chip can be mounted, by applying a photo process to the photoresist, and transferring the pattern of the chip receiving portion on the metal layer by removing the metal layer which is exposed by etching using the patterned photoresist as a mask. The etching is wet etching using an acid solution.

The cutting of step (d) is performed using a laser.

The protection layer of step (e) is composed of one of nickel and a nickel alloy. The protection layer is formed by electroless plating.

Step (c) further comprises forming an oxide layer for a junction on the surface of the metal layer where the chip accommodating portion is formed. The oxide layer for the junction is a black oxide layer.

According to the high-power BGA package of the present invention, a ceramic layer of low conductivity, which is electrically insulated from a metal layer, is interposed between the semiconductor chip and the heat spreader, and thus the heat spreader on the surface of the semiconductor chip can reduce generation of charges between the semiconductor chip and the heat spreader. Accordingly, defects such as electrostatic discharge (ESD) can be reduced when applying an external voltage to high-power BGA package.

BRIEF DESCRIPTION OF THE DRAWINGS

The above objects and advantages of the present invention will become more apparent by describing in detail preferred embodiments thereof with reference to the attached drawings, in which.

DETAILED DESCRIPTION OF THE INVENTION

Figure 1:
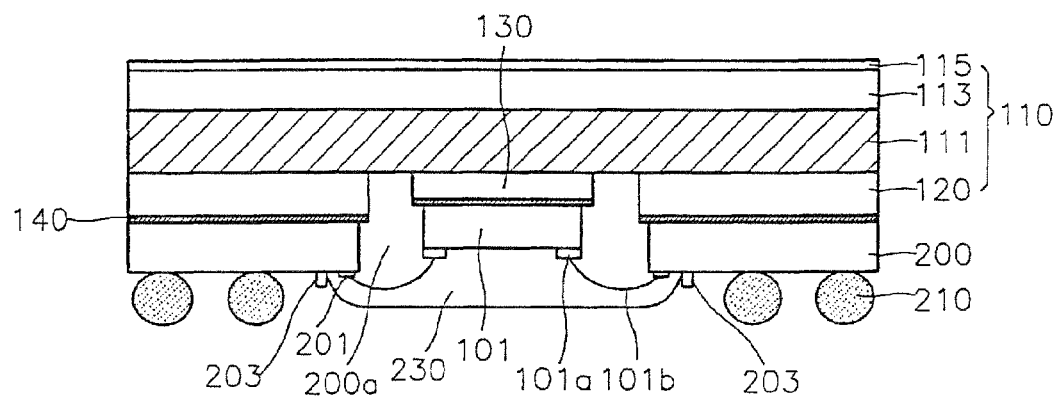
FIG. 1 is a sectional view of a high-power BGA package of the present invention.

The present invention now will be described more fully with reference to the accompanying drawings, in which preferred embodiments of the invention are shown. In the drawings, the shapes of elements are exaggerated for clarity, and like reference numerals are used to refer to like elements throughout.

FIG. 1 is a sectional view of a high-power BGA package of the present invention.

Referring to FIG. 1, the high-power BGA package of the present invention includes a printed circuit board 200 having a square shape and in which metal interconnections (not shown) are embedded and a through portion 200a is formed at the center, a heat spreader 110, and a semiconductor chip 101. The printed circuit board 200 also includes connection pads 201 surrounding the through portion 200a. The heat spreader 110 includes a lower metal layer 120 on the surface of the printed circuit board 200 and an insulating layer 111 formed of a ceramic material. The semiconductor chip 101 has a plurality of metal pads 101a at the center of the bottom surface of the heat spreader 110, the metal pads 101a being mounted outwardly of a through hole 120a of the lower metal layer 120 and connected with the connection pads 201 by gold wires 101b. The BGA package also has a passive film 230 which fills the through portion 200a and forms a protection layer; and a dam 203 which surrounds the outside of the passive film 230 and protrudes from the printed circuit board 200.

The printed circuit board 200 is a square board whose shape is for suitable for the BGA package. An the center of the printed circuit board 200, the through portion 200a, which is square in shape, is formed within the print circuit board 200 so that the semiconductor chip 101 can be mounted therein. Around the through portion 200a, the plurality of connection pads 201 trace the metal interconnections in the printed circuit board 200 and electrically connect the metal interconnections with the semiconductor chip 101.

In the region adjacent to the connection pads 201 on the bottom surface of the printed circuit board 200, solder balls 210 are formed surrounding the through portion 200a. The solder balls 210 are composed of a low melting point eutectic metal alloy including a lead (Pb) or tin (Sn) alloy. When the BGA package is mounted on a mounted body (not shown), a reflow process is performed by applying heat, and the solder balls are melted and alloyed with an adhesive pad (not shown) of the mounted body, thereby allowing the printed circuit board 200 to easily adhere to the mounted body.

Figure 2:
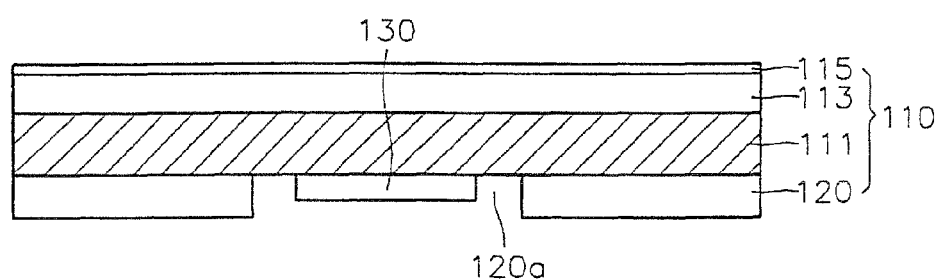
FIG. 2 is a sectional view of a heat spreader that is mounted on the high-power BGA package of the present invention.

FIG. 2 is a sectional view for explaining the heat spreader 110 of FIG. 1 in further detail.

Referring to FIG. 2, on the surface of the printed circuit board 200, the heat spreader 110 of the high-power BGA package is a square board of the same size and shape as the printed circuit board 200 and is formed to contact the upper portion of the through portion 200a. That is, formed on the region on which the printed circuit board 200 contacts are a lower metal layer 120 having a through portion 120a shaped like the through portion 200a of the printed circuit board 200, an insulating layer 111 on the lower metal layer 120, an upper metal layer 113 on the insulating layer 111, and a protection layer 115 on the upper metal layer 113 to protect the surface of the upper metal layer 113.

The insulating layer 111 is composed of a ceramic of a high thermal conductivity, such as AlN, $Al_2O_3$, BeO, or the like. Then, the ceramic functions as an insulating material and a thermal conductor, whereby heat emission can be obtained. The upper metal layer 113 on the insulating layer 111 and the lower metal layer 120 under the insulating layer 111 are grounding electrodes and are composed of copper (Cu), a copper alloy, or the like. Forming a material having a high thermal conductivity, i.e., the upper metal film 113, on the upper portion of the insulating layer 111 enhances the heat emission. In addition, on the surface of the upper metal layer 113, the protection layer 115 may be further formed of nickel Ni, a nickel alloy, or the like, having a good corrosion-resistance so as to protect the surface of the metal layer. Consequently, in the heat spreader 110, the lower metal layer 120 contacts the printed circuit board 200 and the insulating layer 111, and the upper metal layer 113 and the protection layer 115 are sequentially formed on the lower metal layer 120.

FIGS. 3 through 7 are sectional views for showing a sequence of steps in the manufacturing of the heat spreader for the high-power BGA package of the present invention.

Figure 3:
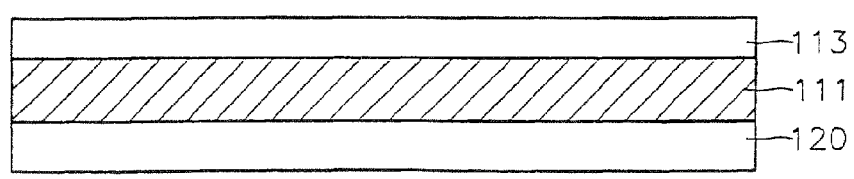
FIGS. 3 through 7 are sectional views for showing a sequence of steps in the manufacturing of the heat spreader for the high-power BGA package of the present invention.

Referring to FIG. 3, firstly, an insulating board 111 having a predetermined size and shape is prepared. (The insulating board will become the insulating layer of the heat spreader, and thus the same reference numeral (111) is used for the insulating board). The insulating board 111 is preferably shaped like a square board so that a greater number of the heat spreaders 110 can be manufactured. Such insulating board 111 is composed of the ceramic having a high thermal conductivity, such as AlN, $Al_2O_3$, or BeO. Thin metal layers are applied to both sides of the prepared insulating board and the lower metal layer 120 and the upper metal layer 113 are arranged on the insulating board 111. Here, the upper and lower metal layers 113 and 120 have high electric and thermal conductivities and are formed of such material as copper (Cu) or a copper alloy. The upper and lower metal layers 113 and 120 are formed on both sides of the insulating board 111 by adhering the prepared thin metal layers to both sides of the insulating board 111 through direct adherence or brazing. Such adherence is advantageous to a low cost production. In addition, the upper and lower metal layers 113 and 120 can be formed by electroless plating or physical vapor deposition.

Figure 4:
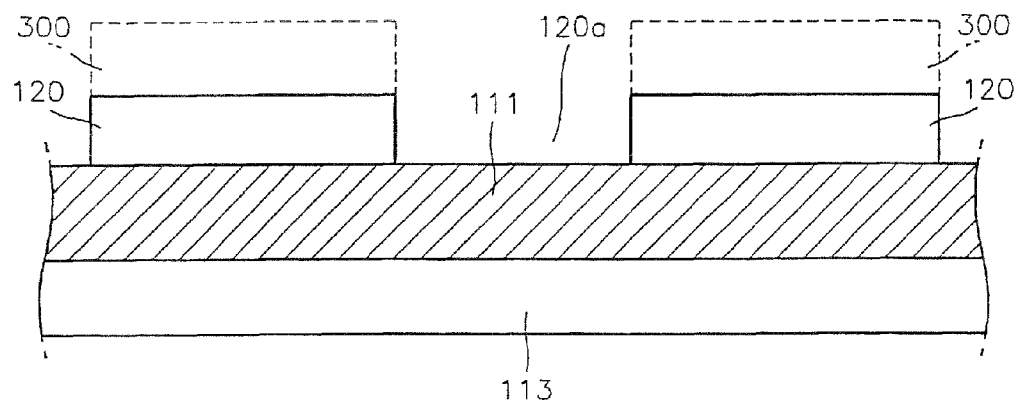

Referring to FIG. 4, a chip receiving portion 120a, where the semiconductor chip 101 will be mounted after a patterning process, is formed on the lower metal layer 120. That is, a photoresist 300 is formed on the lower metal layer 120, and a pattern for the chip receiving portion 120a is formed on the photoresist 300. Then, the exposed metal layer 120 is removed by wet etching using the photoresist 300 as a mask by using a sulfuric acid and a hydrochloric acid, and a pattern of the chip receiving portion 120a is printed on the lower metal layer 120.

When the metal layers are etched using dry etching such as a reactive ion etching (RIE) or plasma etching, finer patterns can be formed.

Figure 5:
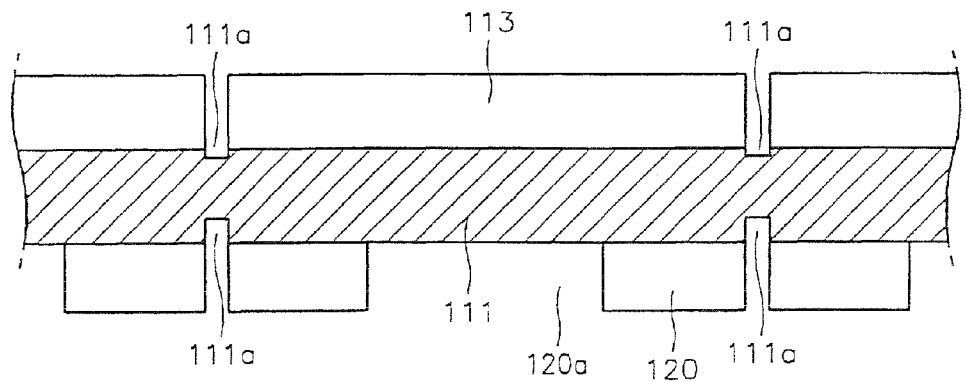

Referring to FIG. 5, a pattern for cutting is formed on the upper metal layer 113 and the lower metal layer 120 so as that the heat spreader 110 can be cut to a predetermined size. Here, the pattern may be cut by a laser cutting using the laser light. The upper and lower metal layers 113 and 120 are completely cut, and then a cutting pattern 111a is formed on the surface of the insulating board so as to depress the insulating board to a predetermined depth. Consequently, the heat spreader 110 can be easily cut to a predetermined size using the cutting pattern 111a on the insulating board 111.

Figure 6:
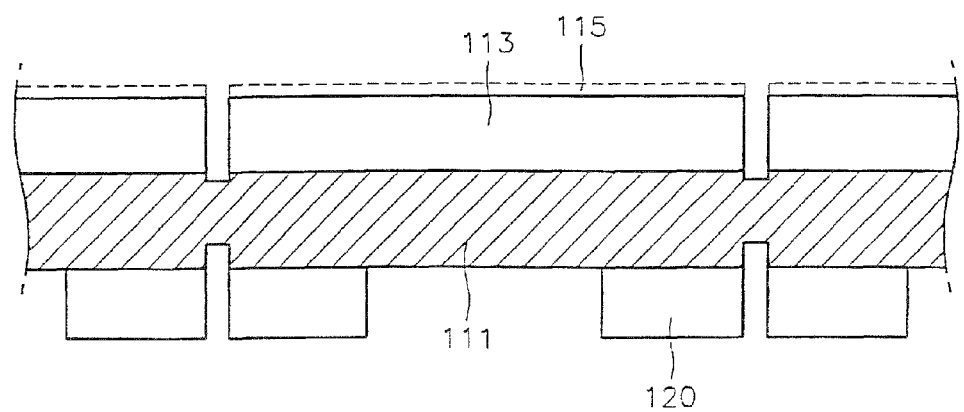

Referring to FIG. 6, the protection layer 115 is formed on the surface of the upper metal layer 113. Here, the protection layer 115 is composed of nickel Ni or a nickel alloy and is formed by the electroless plating, sputtering, or physical vapor deposition such as metal evaporation and thus protects the surface of the metal layers 120 by preventing the surface of the upper metal layer 113 from contacting to outside like an etching environment.

Figure 7:
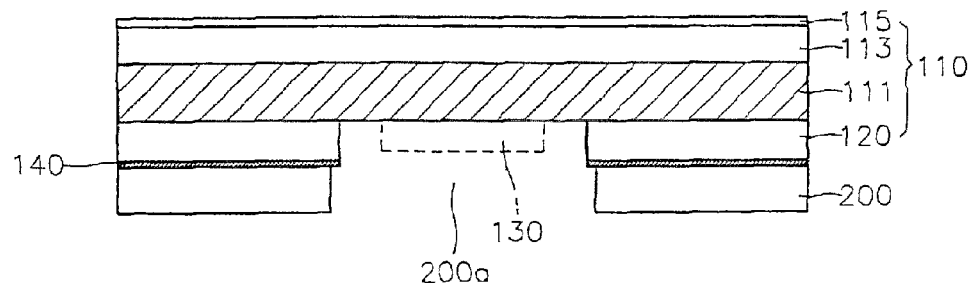
Figure 8:
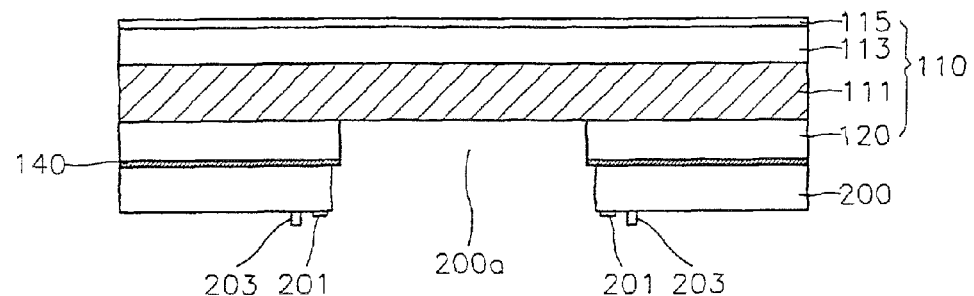
FIGS. 8 through 11 are sectional views for showing a sequence of steps in the manufacturing of the high-power BGA package of the present invention.

Referring to FIG. 7, after the manufacturing is completed, the heat spreader 110 is produced by cutting the heat spreader 110 to a predetermined size using the predetermined cutting method. When mass production of the BGA package process is required, a unit of a plurality of heat spreaders can be cut, e.g., a unit of 8 heat spreaders.

FIGS. 8 through 11 are sectional views for showing a sequence of steps in the manufacturing of the high-power BGA package having the heat spreader described in FIGS. 3 to 7.

Referring to FIGS. 8 through 11, the printed circuit board 200 for the high-power BGA package, which is manufactured according to the conventional method, is conjugated with the heat spreader 110. At the center of the printed circuit board 200, a through portion 200a having a square shape and a predetermined size is formed. At the surface of the printed circuit board 200, a connection pad 201 is formed surrounding the through portion 200a. The other surface of the printed circuit board 200 has a flat junction side to contact the heat spreader 110. The flat junction side is conjugated with the lower metal layer 120 of the heat spreader 110. Here, it is desirable that a junction, such as a black oxide layer 140 is further included on the junction side. The black oxide layer 140 is applied to the metal of the heat spreader 110 so as to improve the junction between a pre-preg, which is a material for the junction of the printed circuit board 200 and the heat spreader 110, and the surface of the contact metal, which is formed of such material as copper or nickel, of the heat spreader 110. A dam 203 protrudes from the bottom of the printed circuit board 200. The dam 203 functions as a sidewall that prevents the material of the passive film 230, a liquid filler from flowing over the dam 203 when the passive film 230 is subsequently formed.

Figure 9:
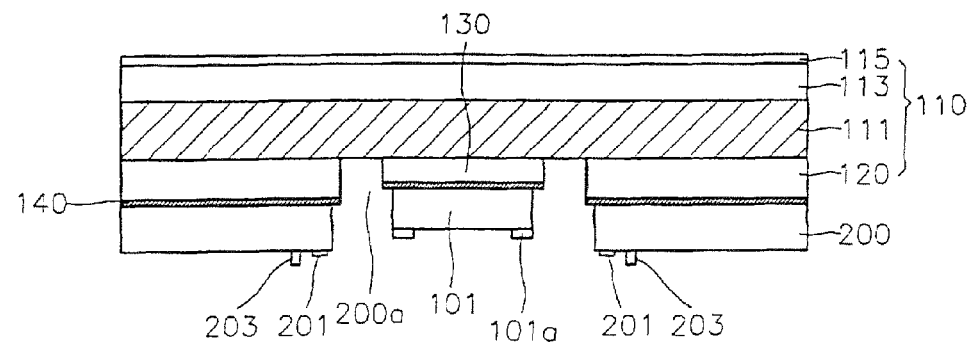

Referring to FIG. 9, a chip supporting body 130 is formed on the bottom surface of the insulating layer of the heat spreader 110, which is exposed by a through portion 200a of the printed circuit board 200, and the semiconductor chip 101 is adhered to the chip supporting body 130. Here, the semiconductor chip 101 is mounted such that the side where a metal pad 101a is formed faces downward.

Figure 10:
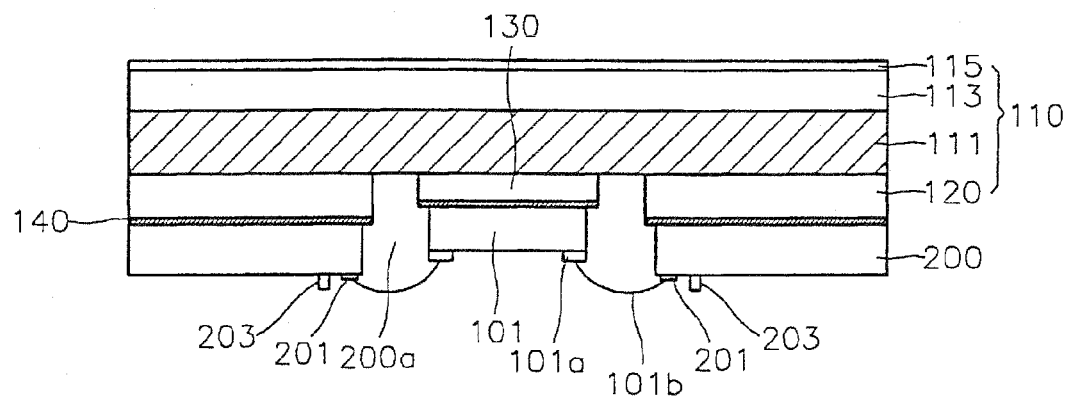

Referring to FIG. 10, metal pads 101a on the semiconductor chip 101 are connected with the connection pads 201 on the printed circuit board 200 via gold wires 101b. The metal pads 101a and the connection pads 201a face downward, and so the gold wires 1 01 b are connected such that the surface of the heat spreader 110 faces downward.

Figure 11:
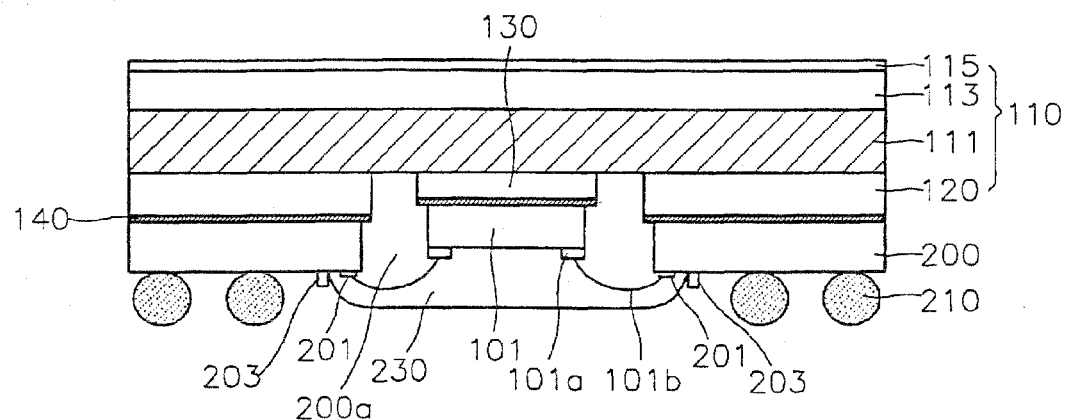
Figure 12:
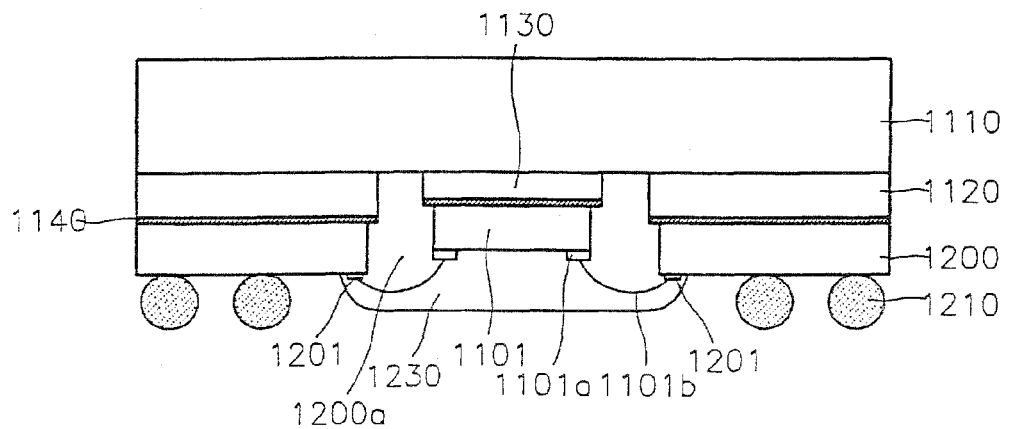
FIG. 12 is a sectional view of the conventional high-power BGA package.

Referring to FIG. 11, a passive film 230 is formed of a synthetic resin to fill the through portion 200a where the semiconductor chip 101 is conjugated and completely cover the region where the connection pads 201 on the printed circuit board 200 are formed and protrudes out within the dam 203 at the bottom of the printed circuit board 200. Then, a plurality of solder balls 201 are formed to surround around the through portion 200a where the printed circuit board 200 is exposed. Here, it is preferable to form the solder balls 201 in the shape of matrix so as to form a high density of solder balls. The dam 203 can be formed when the printed circuit board 200 is manufactured or when the package assembly is manufactured.

As described above, according to the high-power BGA package of the present invention, the heat spreader 110 in which the insulating layer 111 is interposed between the heat spreader 110 and the printed circuit board 200 includes a ceramic of a high conductivity so as to prevent static electricity due to charges flowing between the semiconductor chip 101 and the upper metal layer 113, which functions as ground for the heat spreader 110. By using a ceramic of a high conductivity, it is possible to not only obtain the same heat emission effect as the heat emission of the metal layer but also enhance mechanical strength as a result of the characteristics of the ceramic.

In manufacturing the heat spreader 110, the heat spreader 110 can be easily cut to a predetermined size, and any mistakes made during the cutting of the head spreader 110 can be reduced by forming grooves to a predetermined depth on the insulating board 111 of the heat spreader 110 according to the cutting pattern 111a.

The dam 203 can be formed when the printed circuit board 200 is manufactured or when the package is assembled.

The high-power BGA package and a method for manufacturing the heat spreader of the high-power BGA package according to the present invention are advantageous for the following reasons.

In the high-power BGA package, capacitance, which occurs between the semiconductor chip and the heat spreader, is reduced, and thus the number of defects such as ESD (electrostatic discharge) can be sharply reduced.

Further, through the method for manufacturing the heat spreader of the high-power BGA package, grooves are formed on the insulating board for forming the cutting pattern on the metal layer of the insulating board such that the heat spreader can be easily cut, and any mistakes made during the cutting of the head spreader can be reduced.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A high power ball grid array package comprising:
   a printed circuit board having a through hole at its center, the printed circuit board comprising a substrate, and connection pads on the substrate at one side of the printed circuit board;
   a matrix of solder balls disposed on the printed circuit board at the one side thereof, and surrounding the through hole and the connection pads of the printed circuit board;
   a heat spreader disposed on the other side of the printed circuit board;
   a semiconductor chip mounted to the heat spreader, and including a plurality of bonding pads;
   bonding wires bonding the bonding pads of the semiconductor chip to the connection pads; and
   a passive film filling the through hole at the center of the printed circuit board,
   wherein the heat spreader comprises:
      a chip supporting body to which the semiconductor chip is adhered;
      a ceramic film disposed on the chip supporting body;
      a first metal layer disposed on one surface of the ceramic film;
      a second metal layer disposed on the other surface of the ceramic film and interposed between the ceramic film and the printed circuit board, the second metal layer having a through hole, the chip supporting body being disposed within the through hole of the second metal layer so as to be surrounded by the second metal layer, the chip supporting body being mounted to the ceramic film, and wherein the semiconductor chip is electrically isolated from the metal layers of the heat spreader; and
      a protection layer disposed on the second metal layer and protecting the second metal layer.

2. The high power ball grid array package of claim 1, wherein the ceramic film is composed of at least one of AlN, BeO, and $Al_2O_3$.

3. The high power ball grid array package of claim 1, wherein each of the metal layers is composed of one of copper and a copper alloy.

4. The high power ball grid array package of claim 1, wherein the protection layer is composed of nickel.

5. The high power ball grid array package of claim 4, wherein the protection layer is a plating on a surface of the second metal layer.

6. A heat spreader for a high-power ball grid array package, the heat spreader comprising:
   a board comprising a supporting main body having an upper surface and a bottom surface and composed of a ceramic, an upper metal layer disposed on the upper surface of the supporting main body so as to emit heat transferred thereto from the supporting main body, and a protection layer disposed on the upper metal layer such that upper metal layer is interposed between the supporting main body and the protection layer; and
   a lower metal layer disposed on the bottom surface of the supporting main body, and having a through hole at its center such that the lower metal layer surrounds a region at which a semiconductor chip can be mounted to the heat spreader, whereby the lower metal layer will absorb heat radiating from a chip attached to the heat spreader within the through hole.

7. The heat spreader of claim 6, wherein the supporting main body comprise one of AlN, BeO, and $Al_2O_3$.

8. The heat spreader of claim 6, wherein the upper metal layer and the lower metal layer are each composed of one of copper and a copper alloy.

9. The heat spreader of claim 6, wherein the protection layer is composed of one of nickel and a nickel alloy.

10. The heat spreader of claim 9, wherein the protection layer is a plating of nickel or a nickel alloy on a surface of the upper metal layer.

* * * * *